United States Patent
Levy et al.

(10) Patent No.: US 7,054,604 B2
(45) Date of Patent: May 30, 2006

(54) WIRELESS SIGNAL AMPLIFICATION SYSTEM AND A TELEVISION SIGNAL DECODER COMPRISING ONE SUCH SYSTEM

(75) Inventors: Yannick Levy, Paris (FR); Khaled Maalej, Paris (FR); Emmanuel Hamman, Paris (FR); Amaury Demol, Paris (FR); Julien Schmitt, Palaiseau (FR)

(73) Assignee: Dibcom, Palaiseau (FR)

( * ) Notice: Subject to any disclaimer, the term of this patent is extended or adjusted under 35 U.S.C. 154(b) by 347 days.

(21) Appl. No.: 10/481,014

(22) PCT Filed: May 24, 2002

(86) PCT No.: PCT/FR02/01759

§ 371 (c)(1),
(2), (4) Date: Dec. 17, 2003

(87) PCT Pub. No.: WO03/001689

PCT Pub. Date: Jan. 3, 2003

(65) Prior Publication Data
US 2004/0171362 A1 Sep. 2, 2004

(30) Foreign Application Priority Data
Jun. 21, 2001 (FR) .................... 01 08206

(51) Int. Cl.
*H04B 1/06* (2006.01)
(52) U.S. Cl. .............. 455/234.2; 455/245.2; 455/247.1
(58) Field of Classification Search .......... 455/127.1, 455/127.2, 127.3, 232.1, 234.1, 234.2, 245.1, 455/245.2, 246.1, 246.2, 247.1, 250.1, 251.1; 375/345; 330/278, 291, 295, 310
See application file for complete search history.

(56) References Cited

U.S. PATENT DOCUMENTS

| | | | |
|---|---|---|---|
| 6,687,491 B1* | 2/2004 | Wieck | 455/234.1 |
| 2002/0187764 A1* | 12/2002 | Constantinidis et al. | 455/194.2 |
| 2004/0207761 A1* | 10/2004 | Paik et al. | 348/678 |

FOREIGN PATENT DOCUMENTS

| | | |
|---|---|---|
| EP | 413 311 A2 | 2/1991 |
| EP | 657 997 A1 | 6/1995 |
| EP | 814 568 A1 | 12/1997 |
| EP | 1 020 991 A1 | 7/2000 |

* cited by examiner

Primary Examiner—Nguyen T. Vo
(74) Attorney, Agent, or Firm—Sughrue Mion, PLLC

(57) ABSTRACT

A wireless signal amplification system including amplification apparatus (6) consisting of numerous different amplifiers ($6_1$ to $6_n$) which are distributed in an analogue processing chain (4). Also, a converter (12) for converting analogue signals into digital signals which, at input, are connected to the outlet of the analogue processing chain (4) and, at output, are connected to at least the gain control circuit (16) of the amplification apparatus (6) according to a value that is representative of a characteristic of the wireless signal (1). In this way, sampling of the wireless signal (1) by the converter (12) is optimized. The gain control circuit (16) establishes an average gain control signal (18), and also has, for each of the amplifiers ($6_1$ to $6_n$), a device for calculating an individual gain control signal ($20_i$ to $20_n$) according to a transfer function ($H_1$ to $H_n$) which is specific to each amplifier and which is applied to the average gain control signal.

9 Claims, 3 Drawing Sheets

Figure 1:
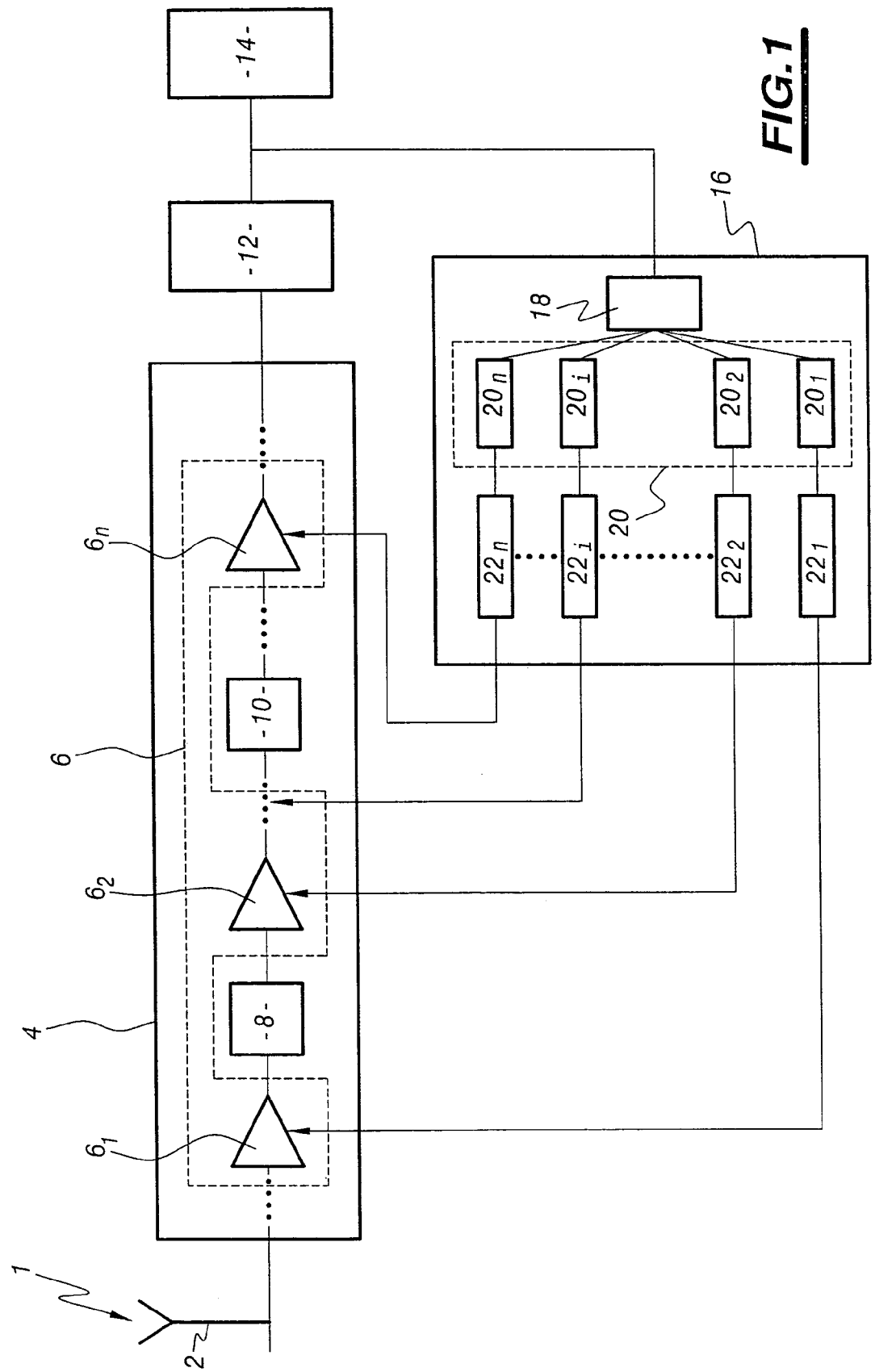

| $40_i$ | |
|---|---|
| 0-0,2 | 0 |
| 0,2-0,4 | 1 |
| 0,4-0,6 | 3 |
| 0,6-0,8 | 1 |
| 0,8-1 | 0 |

WIRELESS SIGNAL AMPLIFICATION SYSTEM AND A TELEVISION SIGNAL DECODER COMPRISING ONE SUCH SYSTEM

The present invention relates to an amplification system for a wireless signal and to a television signals decoder comprising such a system.

The wireless transmission of signals presents certain technological constraints.

The deterioration of such a signal on reception, the attenuation due to the distance separating the receiver from the transmitter and the filtering operations, lead to the obtaining of a utilizable signal of low amplitude.

Therefore, processing chains always include amplification elements whose calibration is fundamental to the utilization of the signal.

In particular, when the signal transmitted corresponds to a digital coding, such as, for example the OFDM (orthogonal frequency distribution multiplexing) coding, it is frequency and amplitude modulated. Hence, the signal exhibits several amplitude levels representative of the digital information transmitted that it is necessary to differentiate on reception in order to reconstruct the signal.

After a first processing of the signal in its analogue form, comprising in particular steps of filtering and of amplification, the signal is converted into a digital signal.

In order for the conversion to be as accurate as possible, the signal should be amplified so that it occupies the entire input range of the conversion means.

Conventionally, the amplification is carried out by several amplifiers distributed throughout the processing chain.

For example, a first amplifier operates at the signal carrier frequency, and another at the intermediate frequency at which the input signal of the demodulator is sampled.

Conventionally, the control of the gain of these amplifiers is carried out with the aid of a loop for detecting the power of the input signal that makes it possible to adjust the amplification.

However, this single control does not make it possible to control the gain of several independent amplifiers. This system can however be improved by adding analogue components making it possible to distribute the total gain between the various amplifiers.

However, this does not offer perfect control, since the various amplifiers are necessarily all in operation and the distribution of the gain remains the same throughout the signal amplification range.

Moreover, the conventional systems readily bring about the saturation of one or other of the amplifiers of the chain, resulting in signal distortion.

The present invention aims to remedy these problems by providing an amplification system equipped with control means making it possible for each of the amplifiers of the system to be controlled individually according to their own control signal.

One subject of the invention is an amplification system for a wireless signal comprising amplification means consisting of a plurality of distinct amplifiers distributed within an analogue processing chain, and means for converting analogue signals into digital signals linked at input, to the output of said analogue processing chain and at output, at least, to means of control of the gain of said amplification means as a function of a value representative of a characteristic of said wireless signal so as to optimize the sampling of said wireless signal by said converter, said control means comprising means for establishing a mean gain 10 control signal, characterized in that said control means furthermore comprise, for each of said amplifiers, means for calculating an individual gain control signal according to each amplifier's own transfer function applied to said mean gain control signal.

According to other characteristics of the invention:

the means for establishing said mean gain control signal comprise means of estimating the power of the wireless signal received and means for determining a mean gain control signal dependent on the power of said wireless signal;

said calculation means comprise for each amplifier, a table defining the transfer function for going between the mean gain control signal and the individual gain control signal corresponding to said amplifier;

said transfer functions define for each amplifier, a succession of linear gains between the mean gain control signal and the individual gain control signals;

said transfer functions are determined successively such that each of the amplifiers operates in a linear regime when the others are locked at their minimum linear gain, so that the overall gain of the amplification means is a linear gain;

at least one of said amplifiers forming said amplification means has analogue control, the corresponding output of said control means then being linked to the control input of this amplifier though digital/analogue conversion means; and at least one of said amplifiers forming said amplification means has digital control, the corresponding output of said control means then being linked directly to the control input of this amplifier.

Another subject to the invention is a television signals decoder using such an amplification system.

According to other characteristics of the invention:

the decoder is adapted for decoding the signals coded according to the OFDM orthogonal frequency division multiplexing protocol.

Figure 2:
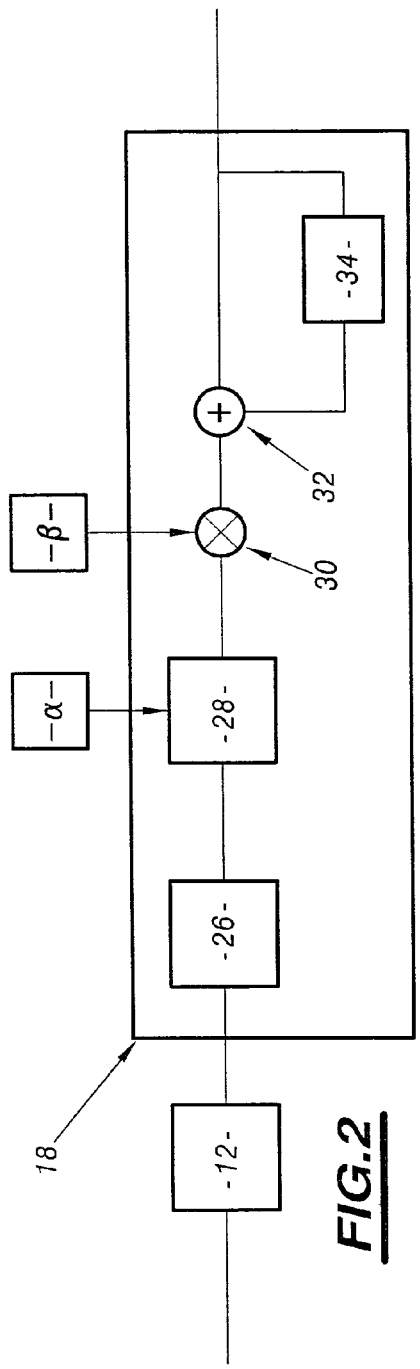
Figure 3:
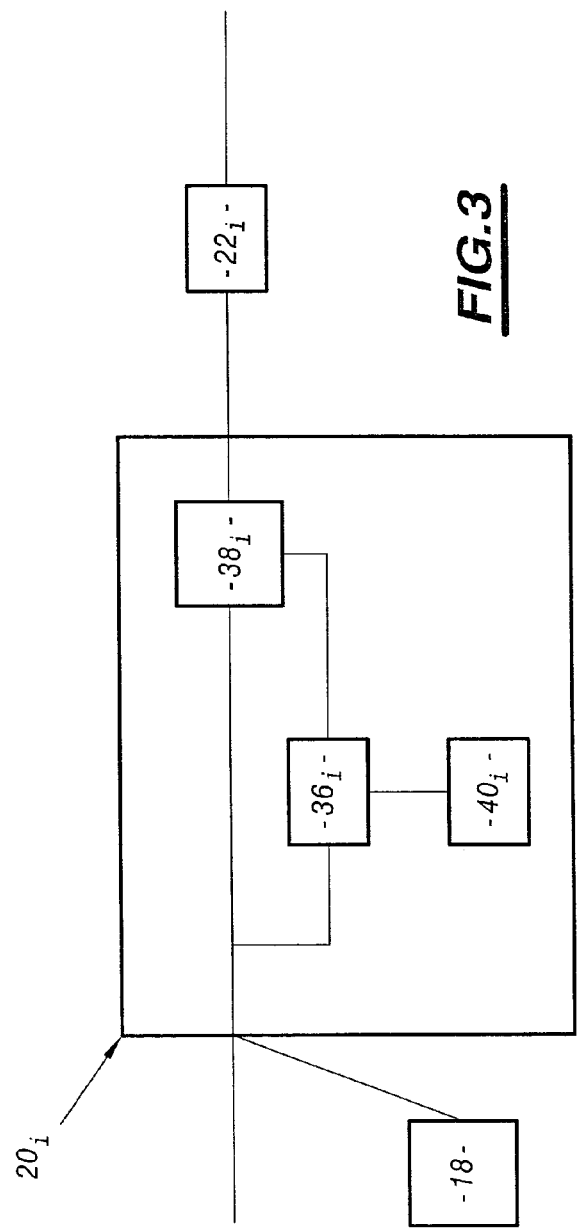
Figures 4, 5:
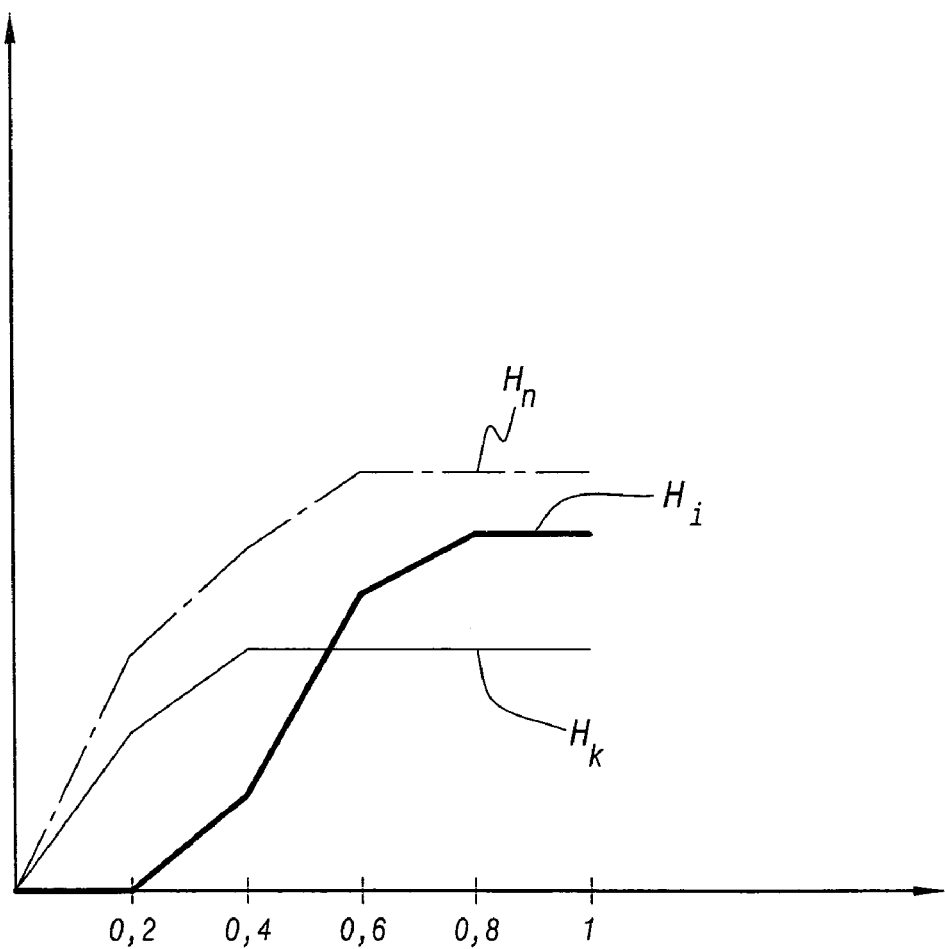

The invention will be better understood on reading the description which follows, given merely by way of example and while referring to the appended drawings, in which:

FIG. 1 represents a schematic diagram of an amplification system according to the invention;

FIGS. 2 and 3 diagrammatically represent the detail of the means of control of the amplifiers of an amplification system according to the invention;

FIG. 4 represents an exemplary table defining the transfer function of the control signal for an amplifier in a system according to the invention; and FIG. 5 is a graphical representation of the transfer functions of each of the control signals of the amplifiers of a system according to the invention.

Represented in FIG. 1 is a system for processing a wireless signal equipped with an amplification system according to the invention.

A wireless signal 1 is received by an antenna 2.

For example, the signal 1 is a television signal transmitted according to the OFDM (orthogonal frequency division multiplexing) protocol.

The signal 1 is introduced into an analogue processing chain 4.

Conventionally, this processing chain 4 groups together several functions and comprises a plurality of amplifiers $6_1$ to $6_n$, which amplifiers constitute amplification means 6 in a conventional manner.

The amplifiers $6_1$ to $6_n$ may be included in functional elements of the processing chain 4 or else be interposed between these elements.

For example, the amplifier $6_1$ is included in a tuner system and is separated from the amplifier $6_2$ by filtering means 8.

Furthermore, the processing chain 4 comprises, for example, conventional means of frequency transposition 10.

It is therefore apparent that, in the configuration described, the amplifiers $6_1$ and $6_2$ operate at the carrier frequency of the wireless signal 1 and the amplifier $6_n$ operates at an intermediate frequency used for a sampling operation.

The output of the processing chain 4 is linked to analogue/digital conversion means 12 that perform the sampling of the signal.

For example, these conversion means 12 are formed by a converter integrated into an electronic component.

The digital signal obtained at the output of the analogue/digital converter 12 is transmitted to a demodulator 14 charged with the interpretation thereof.

For example, the demodulator 14 is a demodulator of television signals coded according to the OFDM protocol.

Control means 16 are also linked to the output of the converter 12 so as to be able to control the amplification means 6 as a function of the processed and digitized wireless signal 1.

The control means 16 comprise, at input, means for establishing a mean gain control signal. This signal makes it possible to determine the overall gain of the amplification means 6 so as to best utilize the input range and the accuracy of the converter 12.

An example of detail of operation of these establishing means 18 is described later with reference to FIG. 2.

Within the context of the invention, the mean control signal is transmitted to calculation means $20_1$ to $20_n$ which make it possible to form, from the mean gain control signal, several individual control signals destined for each of the amplifiers $6_1$ to $6_n$.

These calculation means $20_1$ to $20_n$ are grouped together under the general numerical reference 20.

For each amplifier $6_1$ to $6_n$, a transfer function $H_1$ to $H_n$ is defined for going between the mean gain control signal and the individual gain control signals.

The obtaining and the implementation of one of these transfer functions is described in greater detail with reference to FIG. 3.

Digital control signals specific to each of the amplifiers $6_1$ to $6_n$ are thus obtained.

These signals are then converted back into analogue signals by digital/analogue conversion means $22_1$ to $22_n$ such as integrated converters and transmitted to each of the amplifiers $6_1$ to $6_n$.

For example, the individual gain control signals are dc voltages varying between 0 and 5 V, that control the gain of the amplifiers $6_1$ to $6_n$.

In another configuration, the amplifiers $6_1$ to $6_n$ are adapted to be controlled directly by digital signals thereby dispensing with the need to convert the individual digital control signals into individual analogue control signals.

The system described therefore makes it possible to control each of the amplifiers $6_1$ to $6_n$ individually.

For example, if one wishes to avoid the saturation of the various amplifiers, then amplifiers $6_1$ to $6_n$ are used, the range of whose signal input level is greater and greater. Thus, the amplification means 6 are controlled in such a way that a first amplifier is used for the very weak signals, then the others are used in succession as and when the previous amplifiers reach the limit of their saturation zone and are limited to this gain.

Described in FIG. 2 is the detail of the means for establishing the mean gain control signal 18.

The establishing means 16 receive as input the digital signal originating from the converter 12.

This signal is squared so as to estimate its power by the power estimator means 26.

This value is thereafter introduced into the comparator 28 which subtracts from it a fixed value $\alpha$ representing the theoretical mean power.

This value $\alpha$ is fixed as a function of the parameters of the modulation used and of the converter 12; it corresponds to the optimal mean power for the sampling operation.

A filtering is thereafter performed by virtue of a conventional digital accumulation loop consisting of the multiplier 30 applying a coefficient $\beta$ in conventional manner, of the adder 32 and of the register 34, so as to determine a signal of mean deviation between the power of the wireless signal received 1 and a theoretical mean power.

This signal serves as gain control means signal and is transmitted to the calculation means 20.

Represented in FIG. 3 are the elements constituting the calculation means 20 that make it possible to determine the transfer function of the amplifier $6_i$.

These elements receive at input the mean gain control signal defined by the establishing means 18.

This signal is injected into a comparator $36_i$, as well as into means $38_i$ for determining the individual control signal of the amplifier $6_i$.

The comparator $36_i$ compares the mean gain control signal with an operating table $40_i$ specific to the amplifier $6_i$.

An exemplary operating table is given with reference to FIG. 4.

This table $40_i$ makes it possible to determine the transfer function defining the individual signal for control of the gain of the amplifier $6_i$ as a function of the value of the mean gain control signal.

The value of the mean gain control signal has been arbitrarily normalized between 0 and 1 and this range has been arbitrarily divided into five equal intervals, over which the coefficients 0,1,3,1 and 0 respectively are applied.

Thus, if the mean gain control signal has a normalized value of 0.5, the comparator $36_i$, with the aid of the table $40_i$, determines the transfer function to be applied and transmits this value to the determination means $38_i$.

The latter then apply, in this example, an affine function with director coefficient 3 to the mean gain control signal so as to obtain the individual gain control signal for the amplifier $6_i$.

An individual gain control signal intended for the amplifier $6_i$ is thus obtained from the mean gain control signal and from the operating table $40_i$ specific to the amplifier $6_i$.

This signal is thereafter transmitted to the digital/analogue converter $22_i$ and then to the amplifier $6_i$.

Of course, a set of similar elements is disposed on each circuit for control of the amplifiers $6_1$ to $6_n$.

The calculation means 20 therefore comprise comparators $36_1$ to $36_n$, means of determination $38_1$ to $38_n$ and operating tables $40_1$ to $40_n$.

However, it is conceivable to control several amplifiers in an identical manner by using one and the same group of control elements.

Represented graphically in FIG. 5 is the curve $H_i$ representative of the transfer function stemming from the table $40_i$ described with reference to FIG. 4.

By way of example, also represented are the curves $H_1$ and $H_n$ corresponding to the transfer functions describing the individual signals for gain control of the amplifiers $6_1$ and $6_n$, as a function of the mean gain control signal.

The operating tables $40_1$ to $40_n$ are defined initially as a function of the overall gain to be obtained for the amplification means 6.

Specifically, the overall gain of the amplification means 6 is equal to the sum of the gains of each of the amplifiers $6_1$ to $6_n$. These gains are functions of the individual gain control signals themselves resulting from the application of the transfer functions $H_1$ to $H_n$ to the mean gain control signal.

For example, to determine the transfer functions $H_1$ to $H_n$, in the case where one wishes to obtain a linear overall gain, all the amplifiers $6_1$ to $6_n$ are configured to the minimum gain of their linear zone, except one, then the input signal range 1 is determined, as hence is the mean gain control signal range enabling this amplifier to operate linearly.

Outside of this zone, the individual gain control signal is such that the gain of this amplifier is constant.

These operations are repeated successively for all the amplifiers so as to obtain the set of transfer functions $H_1$ to $H_n$.

The transfer functions $H_1$ to $H_n$ have thus been defined successively so that each of the amplifiers $6_1$ to $6_n$ operates in a linear regime when the others are locked at their minimum linear gain, so that the overall gain of the amplification means 6 is a linear gain.

It is therefore apparent that the present invention makes it possible to maximize the amplification control range for a given set of amplifiers.

In particular, it is possible to amplify signals of very low amplitude without distortion.

Specifically, the present invention makes it possible not to reach the saturation zones of the various amplifiers of the chain, while retaining control of the overall gain of the amplification means.

In particular, one can thus manage to define a linear overall gain while avoiding saturations of the signal at the converter level.

Such control means 16 are, in conventional manner, readily implantable, in digital fashion, in an integrated circuit.

Although one embodiment has been described, it is not regarded as limiting the scope of the present invention.

Specifically, the invention can also make it possible to define an overall gain that is not linear so as, for example, to correct a defect on transmission.

In the same way, such a system may be configured in such as way as to compensate for the defects of certain amplifiers.

Moreover, the example chosen implemented a television signal coded according to the OFDM protocol; of course, the present invention is applicable to types of wireless signals other than those mentioned.

Likewise, within the context of the use of the present invention in an OFDM demodulator, it is conceivable to use the channel estimator in the control means so as to determine the power of the wireless signal received.

It is also conceivable to use means of adapting the coefficients $\alpha$ and $\beta$ as a function of the type of modulation implemented and of the type of converter used.

What invention claimed is:

1. An amplification system for a wireless signal (1) comprising amplification means (6) consisting of a plurality of distinct amplifiers ($6_1$ to $6_n$) distributed within an analogue processing chain (4), and means (12) for converting analogue signals into digital signals linked at input, to the output of said analogue processing chain (4) and at output, at least, to means (16) of control of the gain of said amplification means (6) as a function of a value representative of a characteristic of said wireless signal (1) so as to optimize the sampling of said wireless signal (1) by said converting means (12), said control means (16) comprising means for establishing a mean gain control signal (18), characterized in that said control means (16) furthermore comprise, for each of said amplifiers ($6_1$ to $6_n$), means for calculating an individual gain control signal ($20_1$ to $20_n$) according to each amplifier's own transfer function ($H_1$ to $H_n$) applied to said mean gain control signal.

2. The amplification system as claimed in claim 1, characterized in that the means for establishing said mean gain control signal (18) comprise means (26) of estimating the power of the wireless signal received (1) and means for determining a mean gain control signal dependent on the power of said wireless signal (1).

3. The amplification system as claimed in claim 1, characterized in that said calculation means ($20_1$ to $20_n$) comprise for each amplifier ($6_1$ to $6_n$), a table ($40_1$ to $40_n$) defining the transfer function ($H_1$ to $H_n$) for going between the mean gain control signal and the individual gain control signal corresponding to said amplifier.

4. The amplification system as claimed in claim 3, characterized in that said transfer functions ($H_1$ to $H_n$) define for each amplifier ($6_1$ to $6_n$), a succession of linear gains between the mean gain control signal and the individual gain control signals.

5. The amplification system as claimed in claim 1, characterized in that said transfer functions ($H_1$ to $H_n$) are determined successively such that each of the amplifiers ($6_1$ to $6_n$) operates in a linear regime when the others are locked at their minimum linear gain, so that the overall gain of the amplification means (6) is a linear gain.

6. The amplification system as claimed in claim 1, characterized in that at least one of said amplifiers ($6_1$ to $6_n$) forming said amplification means (6) has analogue control, the corresponding output of said control means (16) then being linked to the control input of this amplifier though digital/analogue conversion means ($22_1$ to $22_n$).

7. The amplification system as claimed in claim 1, characterized in that at least one of said amplifiers ($6_1$ to $6_n$) forming said amplification means (6) has digital control, the corresponding output of said control means (16) then being linked directly to the control input of this amplifier.

8. A television signals decoder, characterized in that it comprises an amplification system as claimed in claim 1.

9. The decoder as claimed in claim 8, characterized in that it is adapted for decoding the signals coded according to the OFDM orthogonal frequency division multiplexing protocol.

* * * * *